(12) United States Patent
Takayama et al.

(10) Patent No.: US 11,894,218 B2
(45) Date of Patent: Feb. 6, 2024

(54) ELECTROSTATIC CHUCK, SUPPORT PLATFORM, AND PLASMA PROCESSING APPARATUS

(71) Applicant: Tokyo Electron Limited, Tokyo (JP)

(72) Inventors: Masato Takayama, Miyagi (JP); Yasuharu Sasaki, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 190 days.

(21) Appl. No.: 16/891,425

(22) Filed: Jun. 3, 2020

(65) Prior Publication Data

US 2020/0388472 A1    Dec. 10, 2020

(30) Foreign Application Priority Data

Jun. 5, 2019 (JP) .................................. 2019-105704

(51) Int. Cl.
*H01J 37/32* (2006.01)
*H02N 13/00* (2006.01)

(52) U.S. Cl.
CPC .. *H01J 37/32715* (2013.01); *H01J 37/32642* (2013.01); *H02N 13/00* (2013.01); *H01J 37/32091* (2013.01); *H01J 2237/002* (2013.01)

(58) Field of Classification Search
USPC .......................................................... 156/915
See application file for complete search history.

(56) References Cited

U.S. PATENT DOCUMENTS

| 2009/0044751 | A1* | 2/2009 | Park | H01L 21/68735 |
| | | | | 118/723 E |
| 2013/0155568 | A1* | 6/2013 | Todorow | H01J 37/32642 |
| | | | | 361/234 |
| 2016/0276204 | A1* | 9/2016 | Sakata | H01L 21/67757 |
| 2017/0069519 | A1* | 3/2017 | Shiraiwa | H01L 21/6831 |
| 2018/0190526 | A1* | 7/2018 | Hao | H01L 21/68735 |

FOREIGN PATENT DOCUMENTS

| JP | H09-213683 | 8/1997 |
| JP | 2000-323841 | 11/2000 |
| JP | 2005-033181 | 2/2005 |
| JP | 2012-227278 P | 11/2012 |
| JP | 2016-225376 | 12/2016 |
| JP | 2018-206935 | 12/2018 |

* cited by examiner

*Primary Examiner* — Ram N Kackar
(74) *Attorney, Agent, or Firm* — IPUSA, PLLC (57) ABSTRACT

There is provision of an electrostatic chuck for supporting a substrate and an edge ring including a first region, a second region, an electrode provided in the second region, and an elastic member. The first region includes a first top surface and is configured to hold the substrate that is placed on the first top surface. The second region extends in a circumferential direction of the first region so as to surround the first region. The second region includes a second top surface, and is configured to support the edge ring placed on the second top surface. The first top surface and the second top surface extend along a single flat plane. A part of the edge ring is accommodated in a space provided between the first region and the second region, and the elastic member is disposed between the part of the edge ring and the electrostatic chuck.

19 Claims, 4 Drawing Sheets

ELECTROSTATIC CHUCK, SUPPORT PLATFORM, AND PLASMA PROCESSING APPARATUS

CROSS-REFERENCE TO RELATED APPLICATIONS

This patent application is based upon and claims priority to Japanese Patent Application No. 2019-105704 filed on Jun. 5, 2019, the entire contents of which are incorporated herein by reference.

TECHNICAL FIELD

The present disclosure relates to an electrostatic chuck, a support platform, and a plasma processing apparatus.

BACKGROUND

In the fabrication of electronic devices, plasma processing is applied to a substrate. In the plasma processing, a plasma processing apparatus is used. The plasma processing apparatus includes a chamber and a support platform. The support platform includes an electrostatic chuck. The substrate is placed on the electrostatic chuck in the chamber, and is held by the electrostatic chuck. To enhance uniformity in the plasma process, a focus ring surrounding the edge of the substrate is disposed on the electrostatic chuck. Such a plasma processing apparatus is described in Patent Document 1 and Patent Document 2.

In the plasma processing apparatus described in Patent Document 1, an electrostatic chuck includes a central portion and an outer portion. A substrate is placed on the central portion. The central portion protrudes upward relative to the outer portion. A diameter of the central portion is smaller than that of the substrate. A focus ring is disposed on the outer portion. The focus ring disposed on the outer portion surrounds the edge of the substrate. The edge of the substrate is positioned on an inner edge portion of the focus ring.

In the plasma processing apparatus described in Patent Document 2, an electrostatic chuck has a flat upper surface. A focus ring is disposed on the upper surface of the electrostatic chuck. The substrate is placed on a region, in the upper surface of the electrostatic chuck, which is surrounded by a focus ring. The edge of the substrate and the focus ring are spaced apart from each other. Thus, at a gap between the edge of the substrate and the focus ring, the electrostatic chuck is exposed.

CITATION LIST

Patent Document

[Patent Document 1] Japanese Laid-open Patent Application Publication No. 2000-323841
[Patent Document 2] Japanese Laid-open Patent Application Publication No. 2018-206935

SUMMARY

In order to suppress generation of particles in the plasma process, it is necessary to prevent byproducts generated in the plasma process from adhering to the electrostatic chuck.

The present disclosure provides an electrostatic chuck, a support platform, and a plasma processing apparatus that prevent deposition of byproducts.

According to one aspect of the present disclosure, an electrostatic chuck for supporting a substrate and an edge ring is provided. The electrostatic chuck includes a first region, a second region, an electrode provided in the second region, and an elastic member. The first region includes a first top surface and is configured to hold the substrate that is placed on the first top surface. The second region extends in a circumferential direction of the first region so as to surround the first region. The second region includes a second top surface, and is configured to support the edge ring placed on the second top surface. The first top surface and the second top surface extend along a single flat plane. A part of the edge ring is accommodated in a space provided between the first region and the second region, and the elastic member is disposed between the part of the edge ring and the electrostatic chuck.

DETAILED DESCRIPTION OF EMBODIMENTS

In the following, embodiments of the present invention will be described with reference to the drawings. Note that in the drawings, elements having substantially identical features are given the same reference symbols and redundant descriptions will not be provided.

<Plasma Processing Apparatus>

Figure 1:
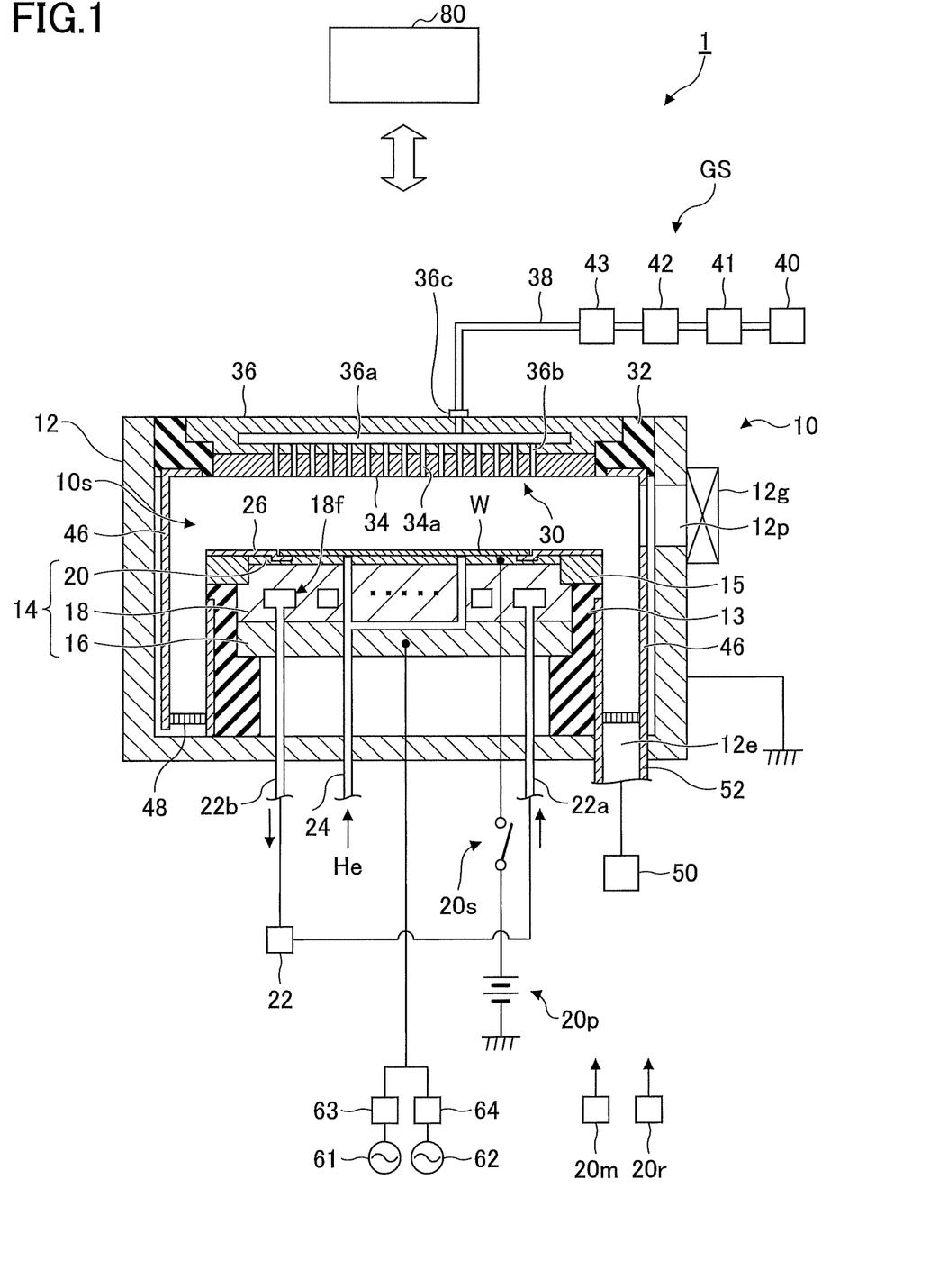
FIG. 1 is a schematic view illustrating a plasma processing apparatus according to an embodiment.

FIG. 1 is a schematic diagram illustrating a plasma processing apparatus according to an embodiment. The plasma processing apparatus 1 illustrated in FIG. 1 is a capacitively coupled type apparatus. The plasma processing apparatus 1 includes a chamber 10. The chamber 10 provides an interior space 10s therein.

The chamber 10 includes a chamber body 12. The chamber body 12 has a generally cylindrical shape. The interior space 10s is provided inside the chamber body 12. The chamber body 12 is formed of, for example, aluminum. A corrosion resistant film is provided on the inner wall of the chamber body 12. The corrosion resistant film may be a film formed from a ceramic such as aluminum oxide or yttrium oxide.

A passage 12p is formed in the side wall of the chamber body 12. A substrate W passes through the passage 12p when the substrate W is transferred between the interior space 10s and an exterior of the chamber 10. The passage 12p can be opened and closed by a gate valve 12g. The gate valve 12g is provided along the side wall of the chamber body 12.

A support 13 is provided on the bottom of the chamber body 12. The support 13 is formed of an insulating material. The support 13 has a generally cylindrical shape. In the interior space 10s, the support 13 extends upward from the bottom of the chamber body 12. A member 15 is provided on the support 13. The member 15 is formed of an insulating material such as quartz. The member 15 may have a generally cylindrical shape. Alternatively, the member 15 may be an annular plate.

The plasma processing apparatus 1 further includes a substrate support platform, i.e., a support platform 14 according to the embodiment. The support platform 14 is supported by the support 13. The support platform 14 is provided in the interior space 10s. The support platform 14 is configured to support the substrate W in the chamber 10, i.e., in the interior space 10s.

The support platform 14 includes a lower electrode 18 and an electrostatic chuck 20 according to the embodiment. The support platform 14 may further include an electrode plate 16. The electrode plate 16 is formed of a conductor, such as aluminum, and has a generally disc shape. The lower electrode 18 is provided on the electrode plate 16. The lower electrode 18 is formed of a conductor, such as aluminum, and has a generally disc shape. The lower electrode 18 is electrically connected to the electrode plate 16. An outer periphery of the lower electrode 18 and an outer periphery of the electrode plate 16 are surrounded by the support 13.

The electrostatic chuck 20 is provided on the lower electrode 18. An outer periphery of the electrostatic chuck 20 and an outer periphery of the lower electrode 18 are surrounded by the member 15. The electrostatic chuck 20 supports the substrate W and an edge ring 26 according to the embodiment. The edge ring 26 may also be referred to as a focus ring. The substrate W has a disc shape, for example, and is placed on an electrostatic chuck 20. The edge ring 26 is disposed on the electrostatic chuck 20 to surround an edge of the substrate W. An outer edge portion of the edge ring 26 may extend on the member 15. Details of the electrostatic chuck 20 and the edge ring 26 are described below.

A flow passage 18f is provided within the lower electrode 18. A heat exchange medium (e.g., refrigerant) is supplied to the flow passage 18f from a chiller unit 22 provided outside the chamber 10 through a pipe 22a. The heat exchange medium supplied to the flow passage 18f is returned to the chiller unit 22 through a pipe 22b. In the plasma processing apparatus 1, a temperature of the substrate W placed on the electrostatic chuck 20 is regulated by heat exchange between the heat exchange medium and the lower electrode 18.

The plasma processing apparatus 1 is provided with a gas supply line 24. The gas supply line 24 supplies a heat transfer gas (e.g., He gas) from the heat transfer gas supply mechanism to a gap between an upper surface of the electrostatic chuck 20 and a back surface of the substrate W.

The plasma processing apparatus 1 further includes an upper electrode 30. The upper electrode 30 is provided above the support platform 14. The upper electrode 30 is supported at the top of the chamber body 12 via the member 32. The member 32 is formed of an insulating material. The upper electrode 30 and the member 32 occlude the top opening of the chamber body 12.

The upper electrode 30 may include a top plate 34 and a support 36. The lower surface of the top plate 34 faces the interior space 10s, and defines the interior space 10s. The top plate 34 may be formed of a low resistance conductor or semiconductor with low Joule heat generation. Multiple gas discharge holes 34a are formed on the top plate 34. The multiple gas discharge holes 34a penetrate the top plate 34 in a thickness direction of the top plate 34.

The support 36 removably supports the top plate 34. The support 36 is formed of an electrically conductive material such as aluminum. Inside the support 36 is a gas diffusion chamber 36a. Multiple gas holes 36b are formed on the support 36. The multiple gas holes 36b extend downward from the gas diffusion chamber 36a. The multiple gas holes 36b communicate with the multiple gas discharge holes 34a, respectively. A gas inlet 36c is formed on the support 36. The gas inlet 36c is connected to the gas diffusion chamber 36a. A gas supply line 38 is connected to the gas inlet 36c.

A gas supply section GS is connected to the gas supply line 38. The gas supply section GS includes gas sources 40, valves 41, flow controllers 42, and valves 43. The gas sources 40 are connected to the gas supply line 38 via the valves 41, the flow controllers 42, and the valves 43. Each of the valves 41 and the valves 43 may be an open/close valve. Each of the flow controllers 42 is a mass flow controller or a pressure-controlled flow controller. Each of the gas sources 40 is connected to the gas supply line 38 via a corresponding open/close valve of the valves 41, a corresponding flow controller of the flow controllers 42, and a corresponding open/close valve of the valves 43.

In the plasma processing apparatus 1, a shield 46 is removably provided along the inner wall surface of the chamber body 12. The shield 46 is also provided on the outer circumference of the support 13. The shield 46 prevents byproducts generated during etching from adhering to the chamber body 12. The shield 46 may be formed by, for example, forming a corrosion resistant film on a surface of a member made of aluminum. The corrosion resistant film may be a film formed from a ceramic such as yttrium oxide.

A baffle plate 48 is provided between the outer circumference of the support 13 and the inner side wall of the chamber body 12. The baffle plate 48 may be formed by, for example, forming a corrosion resistant film on a surface of a member made of aluminum. The corrosion resistant film may be a film formed from a ceramic such as yttrium oxide. Multiple through-holes are formed in the baffle plate 48. An exhaust port 12e is provided below the baffle plate 48 and at the bottom of the chamber body 12. An exhaust device 50 is connected to the exhaust port 12e via an exhaust pipe 52. The exhaust device 50 includes a pressure regulating valve and a vacuum pump such as a turbomolecular pump.

The plasma processing apparatus 1 further includes a first radio frequency power supply 61. The first radio frequency power supply 61 is configured to generate first radio frequency power to generate a plasma from a gas in the chamber 10. The frequency of the first radio frequency power may be, for example, in the range of 27 MHz to 100 MHz.

The first radio frequency power supply 61 is electrically connected to the lower electrode 18 via a matcher 63. The matcher 63 includes matching circuitry. The matching circuitry of the matcher 63 is configured to cause the input impedance of a load (e.g., circuitry at a lower electrode side) of the first radio frequency power supply 61 to match the output impedance of the first radio frequency power supply 61. In another embodiment, the first radio frequency power supply 61 may be electrically connected to the upper electrode 30 via the matcher 63.

The plasma processing apparatus 1 may further comprise a second radio frequency power supply 62. The second radio frequency power supply 62 is configured to generate second radio frequency power. The second radio frequency power has a frequency that is primarily suitable for attracting ions to the substrate W. The frequency of the second radio frequency power may be, for example, in the range of 400 kHz to 13.56 MHz.

The second radio frequency power supply 62 is electrically connected to the lower electrode 18 via a matcher 64. The matcher 64 includes matching circuitry. The matching circuitry of the matcher 64 is configured to cause the input impedance on a load (e.g., circuitry at a lower electrode side) of the second radio frequency power supply 62 to match the output impedance of the second radio frequency power supply 62.

The plasma processing apparatus 1 may further include a controller 80. The controller 80 may be a computer including a processor, a storage section such as a memory, an input device, a display, an input/output interface of signals, and the like. The controller 80 controls each part of the plasma processing apparatus 1. In the controller 80, an operator can perform operations such as a command input operation using the input device, to manage the plasma processing apparatus 1. The controller 80 can also display an operating status of the plasma processing apparatus 1 on the display. The storage section of the controller 80 stores a control program and recipe data. The control program is executed by the processor of the controller 80, to cause the plasma processing apparatus 1 to perform various processes. By the processor of the controller 80 executing the control program and controlling each part of the plasma processing apparatus 1 according to the recipe data, various processes, such as a plasma processing method, are performed in the plasma processing apparatus 1.

<Electrostatic Chuck and Edge Ring>

Figure 2:
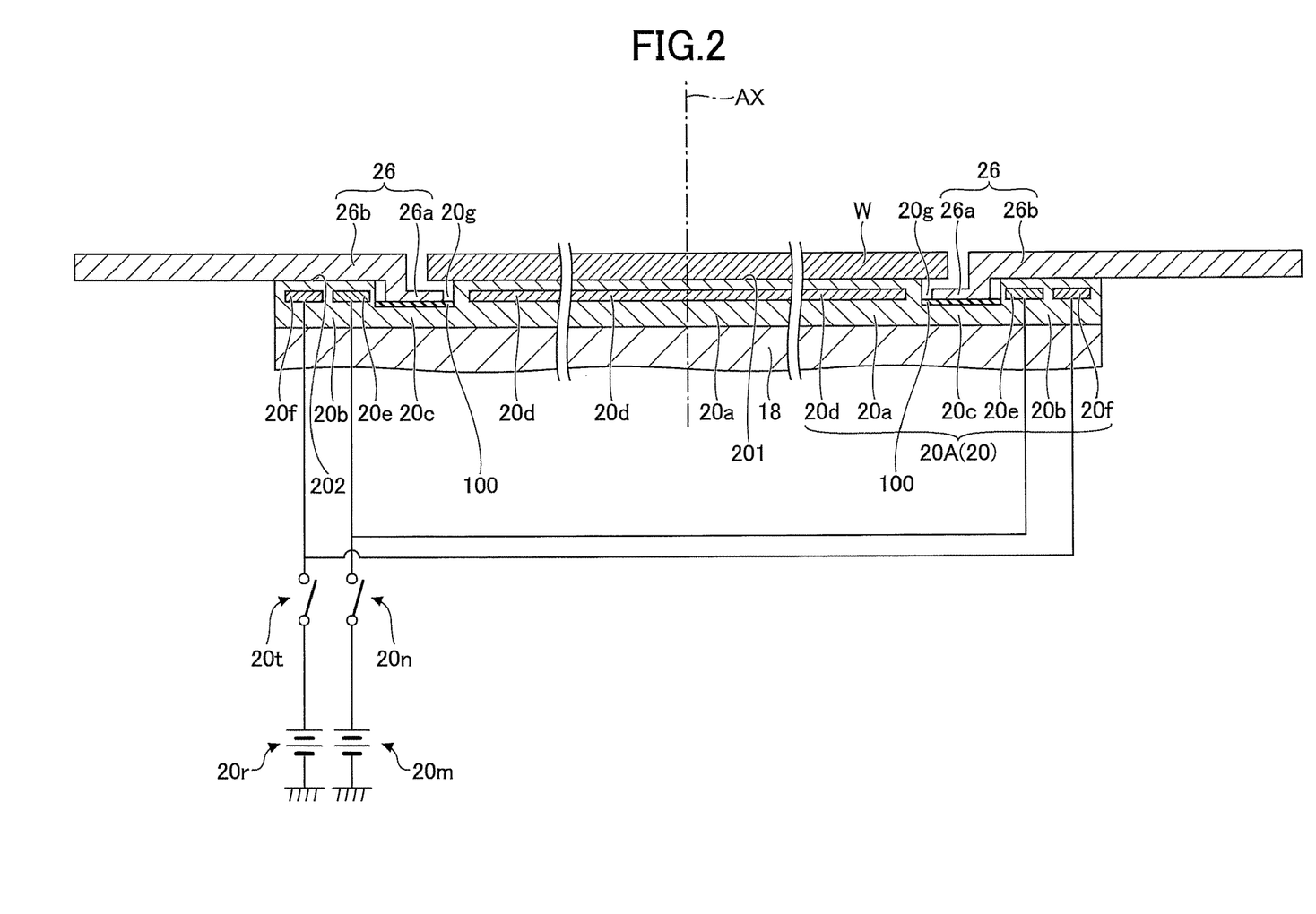
FIG. 2 is a cross-sectional view illustrating a sheet member, an electrostatic chuck, and an edge ring according to the embodiment.

Hereinafter, the electrostatic chuck 20 and the edge ring 26 will be described in detail. In the following description, FIG. 2 is referred, together with FIG. 1. FIG. 2 is a cross-sectional view illustrating an electrostatic chuck and an edge ring according to the embodiment. FIG. 2 illustrates a state in which the edge ring 26 is disposed on an electrostatic chuck 20A. The electrostatic chuck 20A illustrated in FIG. 2 can be used as the electrostatic chuck 20 of the plasma processing apparatus 1.

The electrostatic chuck 20A has a body. The body of the electrostatic chuck 20A has a generally disc shape. The body of the electrostatic chuck 20A is formed of a dielectric material. The body of the electrostatic chuck 20A includes a first region 20a, a second region 20b, and a third region 20c.

The first region 20a has a generally disc shape. The first region 20a includes a first top surface 201. The first region 20a is configured to hold the substrate W that is placed on the first top surface 201. A diameter of the first region 20a is smaller than that of the substrate W.

The electrostatic chuck 20A further includes an electrode 20d. The electrode 20d is a film-shaped electrode. The electrode 20d is provided in the first region 20a. The electrode 20d is connected to a direct-current (DC) power supply 20p via a switch 20s (see FIG. 1). When voltage from the DC power supply 20p is applied to the electrode 20d, electrostatic attractive force is generated between the first region 20a and the substrate W. The substrate W is attracted to the first region 20a by the generated electrostatic attraction attracts, and is held by the first region 20a.

The second region 20b has an annular shape. A center (or a central axis) of the second region 20b is shared with the first region 20a (in FIG. 2, the central axis of the first and second regions 20a and 20b are illustrated by the axis AX). The second region 20b extends in a circumferential direction around its central axis, so as to surround the first region 20a. The second region 20b includes a second top surface 202. The second region 20b is configured to support the edge ring 26 disposed on the second top surface 202. The first top surface 201 of the first region 20a and the second top surface 202 of the second region 20b extend along a single flat plane (a single flat virtual plane).

The electrostatic chuck 20A further includes electrodes 20e and 20f. Each of the electrodes 20e and 20f is a film-shaped electrode. The electrodes 20e and 20f are provided in the second region 20b. Each of the electrodes 20e and 20f extends circumferentially around the central axis of the electrostatic chuck 20A. The electrode 20f is provided outside the electrode 20e. A DC power supply 20m is electrically connected to the electrode 20e via a switch 20n, and a DC power supply 20r is electrically connected to the electrode 20f via a switch 20t. To the electrodes 20e and 20f, DC voltages are applied from the DC power supply 20m and the DC power source 20r, respectively, such that a potential difference occurs between the electrodes 20e and 20f. For example, polarity of the DC voltage applied to the electrode 20e from the DC power supply 20m may be opposite with respect to polarity of the DC voltage applied to the electrode 20f from the DC power supply 20r. Note that two electrodes, such as the electrodes 20e and 20f in FIG. 2, are not required to be provided in the electrostatic chuck 20A, and a single electrode may be provided. In a case in which a single electrode is provided, the electrode is also provided in the second region 20b. When voltages from the DC power supplies 20m and 20r are applied to the electrodes 20e and 20f respectively, an electrostatic attractive force is generated between the second region 20b and the edge ring 26. By the generated electrostatic attractive force, the edge ring 26 is attracted to the second region 20b, and is held by the second region 20b.

The third region 20c is provided between the first region 20a and the second region 20b. The third region 20c is connected to the first region 20a and the second region 20b so as to integrate the first region 20a, the second region 20b, and the third region 20c. That is, the body of the electrostatic chuck 20A is integrated. The body of the electrostatic chuck 20A, i.e., the first region 20a, the second region 20b, and the third region 20c, may be formed from a single dielectric material. That is, the type of dielectric material forming the first region 20a may be the same as that of the dielectric material forming the second region 20b. For example, the body of the electrostatic chuck 20A may be formed from a ceramic such as aluminum oxide or aluminum nitride. In this electrostatic chuck 20A, the thickness of the first region 20a is equal to the thickness of the second region 20b.

A space 20g is provided between the first region 20a and the second region 20b. The first top surface 201 and the second top surface 202 are separated from each other by the space 20g. The space 20g extends circumferentially around the central axis (axis AX in FIG. 2) of the first region 20a and the second region 20b. The space 20g is a groove on the electrostatic chuck 20A, and is provided between the first and second regions 20a and 20b, and on the third region 20c. As described above, the diameter of the first region 20a is smaller than that of the substrate W. Accordingly, when the substrate W is placed on the first top surface 201, the edge of the substrate W is positioned on the space 20g.

The edge ring 26 is an annular member. The edge ring 26 may be formed from, but is not limited to, silicon, silicon carbide, or quartz. The edge ring 26 has a first portion 26a and a second portion 26b.

Each of the first portion 26a and the second portion 26b has an annular shape. An inner diameter of the second portion 26b is larger than the diameter of the substrate W. The first portion 26a shares the central axis (axis AX in FIG. 2) with the second portion 26b. The second portion 26b extends on the first portion 26a. An inner diameter of the first portion 26a is smaller than the inner diameter of the second portion 26b. An outer diameter of the first portion 26a is smaller than an outer diameter of the second portion 26b and larger than the inner diameter of the second portion 26b. The inner diameter of the first portion 26a is larger than an outer diameter of the first region 20a of the electrostatic chuck 20A. Note that the outer diameter of the first region 20a corresponds to the inner diameter of the space 20g. The outer diameter of the first portion 26a is smaller than the inner diameter of the second region 20b of the electrostatic chuck 20A (i.e., the outer diameter of the space 20g). The outer diameter of the first portion 26a may be the same as the inner diameter of the second region 20b of the electrostatic chuck 20A.

The second portion 26b of the edge ring 26 is disposed on the second region 20b of the electrostatic chuck 20A. The first portion 26a of the edge ring 26 is accommodated within the space 20g provided by the electrostatic chuck 20A. When DC voltage is applied from the DC power supply 20m to the electrode 20e and DC voltage is applied from the DC power supply 20r to the electrode 20f, electrostatic attractive force is generated between the second region 20b and the second portion 26b of the edge ring 26. By the generated electrostatic attractive force, the second portion 26b of the edge ring 26 is attracted to the second region 20b of the electrostatic chuck 20A, and held by the second region 20b.

As described above, the first and second top surfaces 201 and 202 of the electrostatic chuck 20A extend along a single flat plane (virtual plane). Thus, a difference between an electric field (e.g., field strength) above the substrate W placed on the first region 20a and an electric field (e.g., field strength) above the edge ring 26 placed on the second region 20b is reduced while a plasma is generated above the electrostatic chuck 20.

Further, the edge ring 26 is disposed on the electrostatic chuck 20A such that the first portion 26a is accommodated within the space 20g. The substrate W is placed on the electrostatic chuck 20A such that an edge surface of the substrate W faces the inner edge surface of the second portion 26b of the edge ring 26 and the edge of the substrate W is positioned above the first portion 26a of the edge ring 26. However, the edge of the substrate W may be positioned inside the inner edge surface of the first portion 26a.

A sheet member 100 is disposed between an upper surface of the third region 20c of the electrostatic chuck 20A and a back surface of the first portion 26a of the edge ring 26. The sheet member 100 is formed in an annular shape, and is disposed over the entire circumference. The sheet member 100 shares the central axis (axis AX in FIG. 2) with the third region 20c. The sheet member 100 is an elastic material, and may be, for example, a spongy Teflon (registered trademark) sheet or the like. When DC voltage is applied from the DC power supply 20m and the DC power supply 20r, an external force is applied to the sheet member 100 due to electrostatic attractive force generated between the second region 20b and the second portion 26b of the edge ring 26. This deforms the sheet member 100, thereby eliminating the gap between the third region 20c and the first portion 26a of the edge ring 26 and increasing adhesion between the sheet member 100 and the second region 20b and between the sheet member 100 and the second portion 26b of the edge ring 26.

The sheet member 100 is an example of an elastic member, and the elastic member may be not limited to Teflon (registered trademark), but may be formed of an elastic material. For example, the elastic member may be formed of resin. Also, the elastic member may be a sheet-like member or a film-like member. This eliminates the gap between the first portion 26a contained in the space 20g and the electrostatic chuck 20A.

Figure 3:
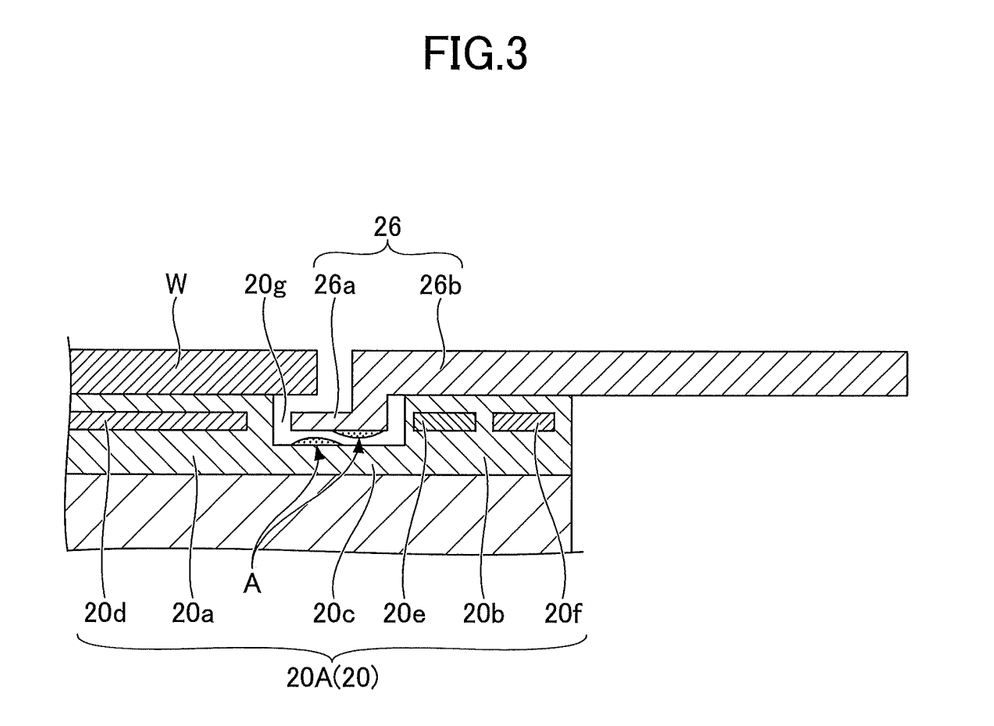
FIG. 3 is a diagram for explaining a problem.

As illustrated in FIG. 3, when byproducts generated in the plasma process or radicals in a plasma generated in the chamber 10 enter the gap between the first portion 26a accommodated in the space 20g and the electrostatic chuck 20A, byproducts A or the like adheres to the gap and the byproducts A may cause generation of particles. In addition, the electrostatic chuck 20A may be corroded by radicals entering the space 20g.

In contrast, in the present embodiment, the sheet member 100 eliminates the gap between the electrostatic chuck 20A and the first portion 26a. Therefore, because it is possible to prevent byproducts or radicals entering the space 20g, generation of the particle caused by byproducts adhering in the space 20g can be avoided, and corrosion of the electrostatic chuck 20A caused by radicals entering the space 20g can be avoided.

The material of the sheet member 100 is preferably plasma resistant. This allows corrosion of the sheet member 100 to be suppressed when the sheet member 100 is exposed to radicals in the plasma.

VARIATIONS

Figure 4A:
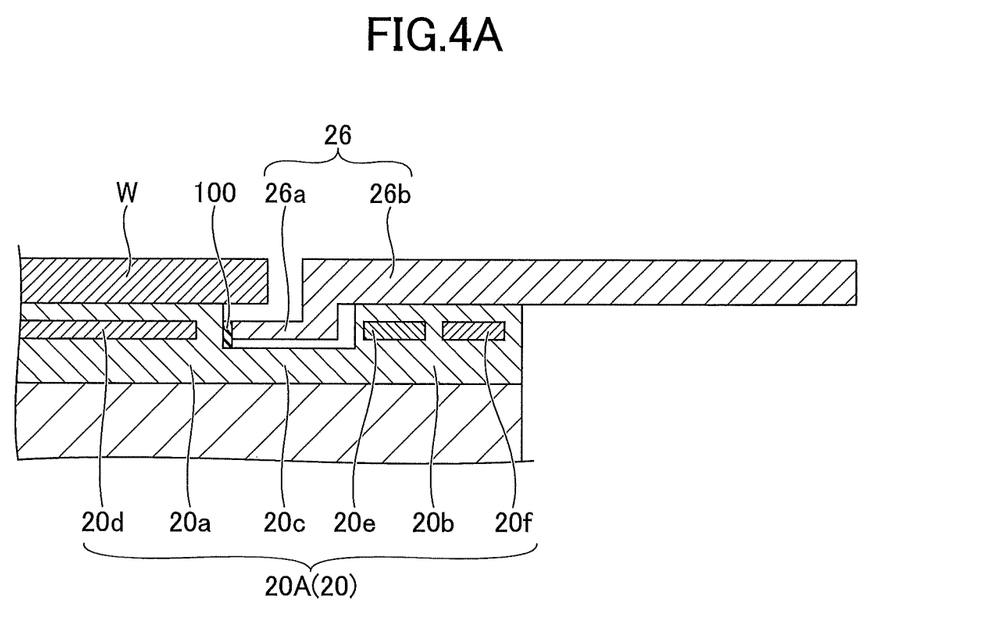
FIG. 4A is a cross-sectional view illustrating the sheet member, the electrostatic chuck, and the edge ring according to a variation of the embodiment.
Figure 4B:
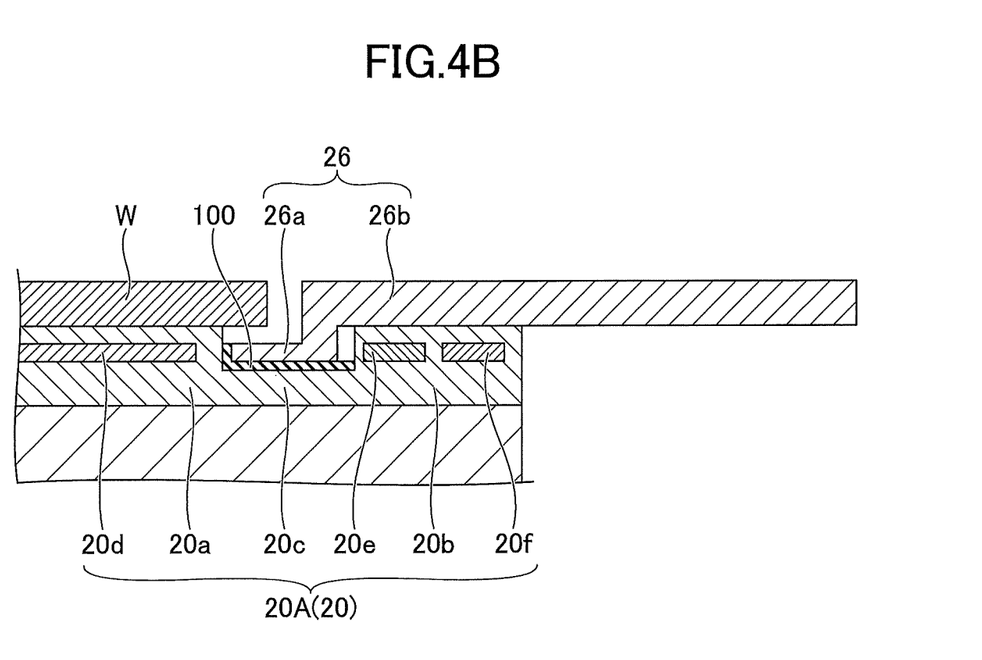
FIG. 4B is a cross-sectional view illustrating the sheet member, the electrostatic chuck, and the edge ring according to another variation of the embodiment.

Structures and arrangement of the sheet member 100 according to variations of the present embodiment will be described with reference to FIGS. 4A and 48. FIGS. 4A and 4B are cross-sectional views illustrating sheet members, electrostatic chucks, and edge rings according to the variations of the present embodiment.

For example, as illustrated in FIG. 4A, the sheet member 100 may be disposed vertically below the substrate W in the space 20g. Also, as illustrated in FIG. 4B, the sheet member 100 may be disposed vertically and horizontally.

Specifically, in FIG. 4A, the sheet member 100 whose cross-section extends vertically and is of an I-shape is disposed between the outer edge surface of the first region 20a and the inner edge surface of the first portion 26a. In FIG. 4B, the sheet member 100 having an L-shaped cross-section is disposed. The respective sheet members 100 illustrated in FIGS. 4A and 4B can reduce entry of byproducts and radicals into the space 20g. This can significantly reduce generation of the particle caused by byproducts adhering in the space, and can minimize corrosion of the electrostatic chuck 20A caused by radicals entering the space 20g.

The sheet member 100 may be composed of multiple discrete sheets. For example, the L-shaped sheet member 100 illustrated in FIG. 4B may be divided into an I-shaped sheet having a vertically extending cross-section and an I-shaped sheet having a horizontally extending cross-section. However, the respective discrete parts of the sheet member 100 need to be disposed between an upper surface of the third region 20c and a back surface of the first portion 26a of the edge ring 26 (between a back surface of the first portion 26a and a portion of the surface of the electrostatic chuck 20A facing the back surface of the first portion 26a) and/or between the outer edge surface of the first region 20a and the inner edge surface of the first portion 26a over the entire circumference, such that a gap between the upper surface of the third region 20c and the back surface of the first portion 26a of the edge ring 26 is eliminated and/or a gap between the outer edge surface of the first region 20a and the inner edge surface of the first portion 26a is eliminated.

As described above, the electrostatic chuck 20, the support platform 14, and the plasma processing apparatus 1 according to the present embodiment can prevent byproducts generated in plasma processing from entering the space 20g. Also, entry of radicals in the plasma generated in the chamber 10 into the space 20g is prevented. This can suppress generation of particles.

The electrostatic chuck, support platform, and plasma processing apparatus in accordance with the embodiments disclosed herein are to be considered exemplary in all respects and not limiting. The above embodiments may be modified and enhanced in various forms without departing from the appended claims and spirit thereof. Matters described in the above embodiments may take other configurations to an extent not inconsistent, and may be combined to an extent not inconsistent.

The plasma processing apparatus of the present disclosure is applicable to any of the following types of processing apparatuses: an atomic layer deposition (ALD) apparatus, a capacitively coupled plasma (CCP) type processing apparatus, an inductively coupled plasma (ICP) type processing apparatus, a processing apparatus using a radial line slot antenna (RLSA), an electron cyclotron resonance plasma (ECR) type processing apparatus, and a helicon wave plasma (HWP) type processing apparatus.

What is claimed is:

1. An electrostatic chuck for supporting a substrate and an edge ring including a first portion and a second portion, the electrostatic chuck comprising:
   a first region including a first top surface, the first region being configured to hold the substrate that is placed on the first top surface;
   a second region extending in a circumferential direction of the first region so as to surround the first region, the second region including a second top surface, and being configured to support the edge ring that is placed on the second top surface, the second region and first region being made of the same dielectric material, and the second portion of the edge ring being on the second top surface;
   an electrode provided in the second region; and
   an elastic sheet; wherein the first top surface and the second top surface extend along a single flat plane;
   a groove is provided between the first region and the second region;
   the first portion of the edge ring is accommodated in the groove so that the top surface of the first portion is below the lower surface of the second portion, the two portions being connected by an annular vertical wall; and
   the elastic sheet is disposed between the first portion of the edge ring and the electrostatic chuck.

2. The electrostatic chuck according to claim 1, wherein the first portion has an annular shape, and the second portion has an annular shape, the second portion sharing a central axis with the first portion;
   the second portion extends on the first portion;
   an inner diameter of the first portion is smaller than an inner diameter of the second portion; and
   an outer diameter of the first portion is smaller than an outer diameter of the second portion.

3. The electrostatic chuck according to claim 2, wherein the elastic sheet is disposed at a first gap between an outer edge surface of the first region and an inner edge surface of the first portion, at a second gap between a back surface of the first portion and a surface of the electrostatic chuck facing the back surface of the first portion, or both at the first gap and the second gap.

4. The electrostatic chuck according to claim 3, further comprising a third region provided between the first region and the second region; the third region being connected to the first region and the second region to integrate the first region, the second region, and the third region; wherein
   the groove is provided on the third region; and
   the second gap being a gap between the back surface of the first portion and an upper surface of the third region.

5. A support platform comprising:
   an electrode plate; and
   the electrostatic chuck according to claim 1, the electrostatic chuck being disposed above the electrode plate.

6. The support platform according to claim 5, wherein the first portion has an annular shape, and the second portion has an annular shape, the second portion sharing a central axis with the first portion;
   the second portion extends on the first portion;
   an inner diameter of the first portion is smaller than an inner diameter of the second portion; and
   an outer diameter of the first portion is smaller than an outer diameter of the second portion.

7. A plasma processing apparatus comprising:
   a chamber; and
   a support platform configured to support a substrate in the chamber, the support platform including
   an electrode plate; and
   the electrostatic chuck according to claim 1, the electrostatic chuck being disposed above the electrode plate.

8. The plasma processing apparatus according to claim 7, further comprising the edge ring: wherein
   the first portion has an annular shape and the second portion has an annular shape, the second portion sharing a central axis with the first portion;
   the second portion extends on the first portion;
   an inner diameter of the first portion is smaller than an inner diameter of the second portion;
   an outer diameter of the first portion is smaller than an outer diameter of the second portion.

9. The electrostatic chuck according to claim 1, wherein the elastic sheet is disposed between an outer edge surface of the first region and an inner edge surface of the first portion of the edge ring.

10. The electrostatic chuck according to claim 1, wherein the elastic sheet is disposed between a bottom surface of the groove and a back surface of the first portion of the edge ring.

11. The electrostatic chuck according to claim 9, wherein the elastic sheet is disposed between a bottom surface of the groove and a back surface of the first portion of the edge ring.

12. The electrostatic chuck according to claim 1, wherein the edge ring is attracted to the second region by an electrostatic attractive force generated by a voltage being applied to the electrode in the second region.

13. The electrostatic chuck according to claim 9, wherein the edge ring is attracted to the second region by an electrostatic attractive force generated by a voltage being applied to the electrode in the second region.

14. The electrostatic chuck according to claim 10, wherein
   the edge ring is attracted to the second region by an electrostatic attractive force generated by a voltage being applied to the electrode in the second region.

15. The electrostatic chuck according to claim 11, wherein the edge ring is attracted to the second region by an electrostatic attractive force generated by a voltage being applied to the electrode in the second region.

16. The electrostatic chuck according to claim 1, wherein
the edge ring is attracted to the second region by an electrostatic attractive force generated by a voltage being applied to the electrode in the second region such that the elastic sheet is deformed by the first portion of the edge ring.

17. The electrostatic chuck according to claim 9, wherein
the edge ring is attracted to the second region by an electrostatic attractive force generated by a voltage being applied to the electrode in the second region such that the elastic sheet is deformed by the first portion of the edge ring.

18. The electrostatic chuck according to claim 10, wherein
the edge ring is attracted to the second region by an electrostatic attractive force generated by a voltage being applied to the electrode in the second region such that the elastic sheet is deformed by the first portion of the edge ring.

19. The electrostatic chuck according to claim 11, wherein
the edge ring is attracted to the second region by an electrostatic attractive force generated by a voltage being applied to the electrode in the second region such that the elastic sheet is deformed by the first portion of the edge ring.

* * * * *